United States Patent [19]

Yamano et al.

[11] Patent Number: 4,670,293
[45] Date of Patent: Jun. 2, 1987

[54] METHOD OF MAKING SEMICONDUCTOR FILM

[75] Inventors: Masaru Yamano, Hirakata; Yukinori Kuwano, Katano; Shoichi Nakano, Hirakata; Tsugufumi Matsuoka, Hirakata; Souichi Sakai, Hirakata; Hirosato Yagi, Hirakata; Nobuhiro Okuda, Higashiosaka, all of Japan

[73] Assignee: Sanyo Electric Co., Ltd., Osaka, Japan

[21] Appl. No.: 899,789

[22] Filed: Aug. 22, 1986

Related U.S. Application Data

[63] Continuation of Ser. No. 635,671, Jul. 30, 1985, abandoned.

[30] Foreign Application Priority Data

| Jul. 29, 1983 | [JP] | Japan | 58-139546 |
| Sep. 12, 1983 | [JP] | Japan | 58-168761 |
| Sep. 12, 1983 | [JP] | Japan | 58-168762 |
| Sep. 21, 1983 | [JP] | Japan | 58-147431[U] |
| Sep. 28, 1983 | [JP] | Japan | 58-181291 |
| Jan. 9, 1984 | [JP] | Japan | 59-2292 |
| Sep. 12, 1986 | [JP] | Japan | 58-168763 |

[51] Int. Cl.[4] .............................. B05D 3/06
[52] U.S. Cl. ........................ 427/39; 427/86
[58] Field of Search ............... 427/39, 86

[56] References Cited

U.S. PATENT DOCUMENTS

| 4,064,521 | 12/1977 | Carlson | 357/2 |
| 4,252,837 | 2/1981 | Auton | 427/39 |
| 4,452,828 | 6/1984 | Namba et al. | 427/39 |
| 4,461,783 | 7/1984 | Yamazaki | 427/39 |
| 4,473,597 | 9/1984 | Pankove | 427/39 |
| 4,515,107 | 5/1985 | Fournier et al. | 427/39 X |
| 4,569,719 | 2/1986 | Coleman | 427/39 X |

FOREIGN PATENT DOCUMENTS 57-6854 4/1982 Japan .
58-11261 1/1983 Japan .

Primary Examiner—Bernard D. Pianalto
Attorney, Agent, or Firm—Armstrong, Nikaido, Marmelstein & Kubovcik

[57] ABSTRACT

A method of making a semiconductor film on a substrate having a non-flat surface, by placing the substrate in a reaction chamber including at least a pair of discharge electrodes, an inlet of a reaction gas for producing a desired semiconductor film, and an outlet for reduced pressure, and performing a discharge in the presence of said reacrion gas for producing said semiconductor film, while arranging said non-flat surface of said substrate outside a plasma region formed between said discharge electrodes and further locating said non-flat surface substantially in a vertical direction with respect to electrode surfaces of said discharge electrodes, thereby semiconductor film being directly and uniformly deposited on said non-flat surface of said substrate, which is of worth in the production of, e.g., roofing tile-shaped photovoltaic devices.

10 Claims, 23 Drawing Figures

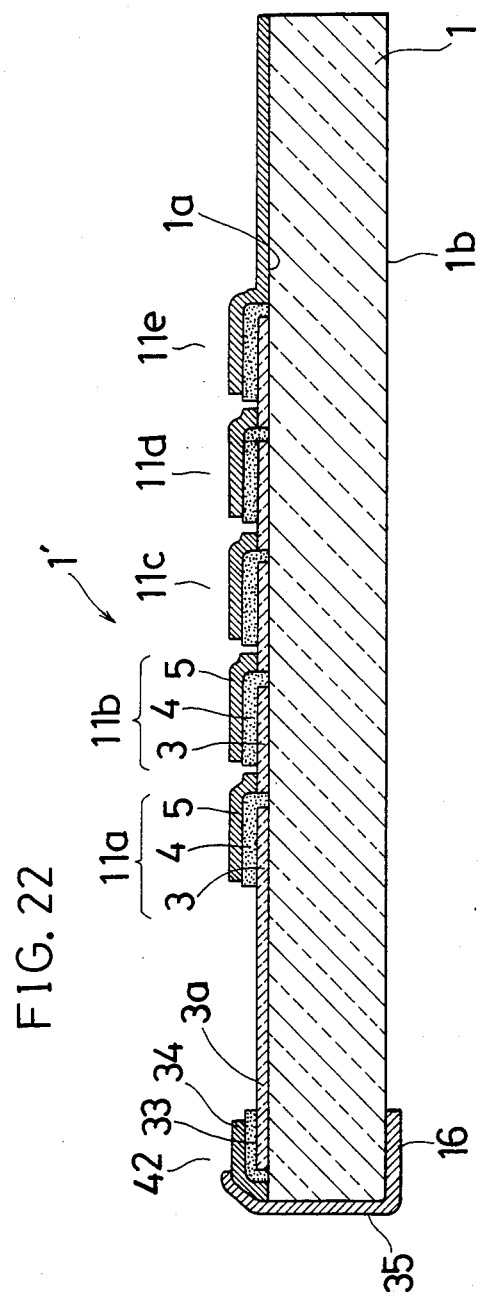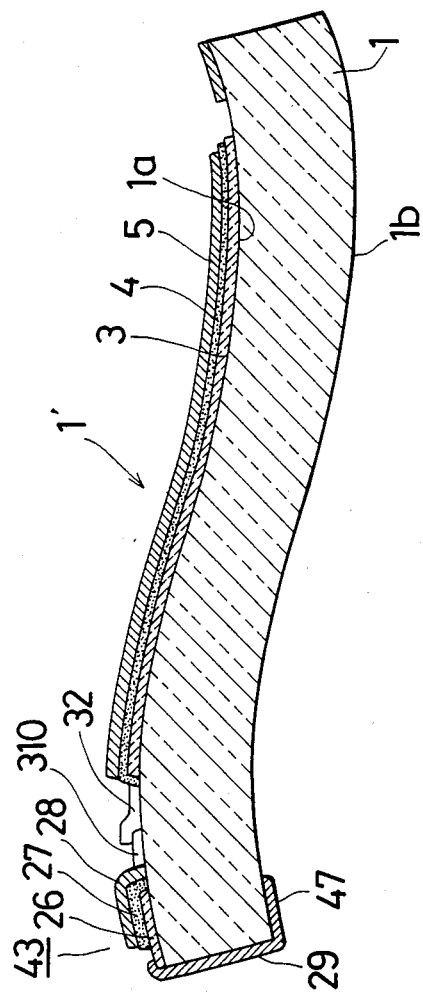

METHOD OF MAKING SEMICONDUCTOR FILM

This application is a continuation of application Ser. No. 635,671, filed July 30, 1985, now abandoned.

BACKGROUND OF THE INVENTION

1. Field of the Invention

This invention relates to a method of making a semiconductor film, and more particularly to a method of making a semiconductor film and a photovoltaic device for depositing a semiconductor film by plasma decomposition of a reaction gas on a non-flat surface combined with a curved or flat surface of a substrate.

2. Description of the Prior Art

A semiconductor film of an amorphous silicon system obtained by the plasma decomposition of the reaction gas has been used as photovoltaic devices, so called solar cells for directly converting solar energy to electrical energy, photoconductive drums for electronic photography or copiers, and the like. Since photovoltaic devices employ inexhaustible solar energy as an energy source, they have attracted the attention as a solution to the problem associated with exhaustion of energy resources. The sun renders the energy of about 1 kW/m$^2$ to the ground during fine weather. When the photovoltaic device for converting such solar energy to electrical enerry is used in a home as a power source, it is generally installed on the rooftop or roof of the house.

Roofing tiles provided with solar cells, that is, tile-shaped photovoltaic devices, as disclosed in Japanese published unexamined patent application No. 57-68454 or Japanese published unexamined utility model application No. 58-11261, are suitable for home power sources.

One object of the present invention is to provide a method of making a semiconductor film for depositing a good semiconductor film on a curved surface of a substrate such as a photoconductive drum or roofing tile with solar cells suitable for the home power source.

It has been known that an amorphous silicon film is produced by a glow discharge in a silicon compound atmosphere as disclosed in Japanese published examined patent application No. 53-37718 (U.S. Pat. No. 4,064,521). The formation of the amorphous semiconductor film by using known glow discharge has such a disadvantage that since a glass or stainless steel substrate to deposit the semiconductor film is located between opposing parallel electrodes for exciting the glow discharge, the substrate is intersected with the moving direction of high speed charged particles of plasma in the moving range with the result that the high speed charged particles in the plasma impinge upon the substrate surface, thereby deteriorating characteristics of a transparent conductive film previously deposited on the substrate or the amorphous semiconductor film gradually deposited on the substrate. In addition, although the surface of the substrate to deposit the amorphous semiconductor film is flat, the substrate according to the present invention is of curved surface. Therefore, when the substrate with the curved surface is arranged between parallel flat electrodes as in the conventional technique, the distance between the curved surface and one of parallel flat electrodes becomes unequal, so that the deposited amorphous semiconductor film may not become uniform.

Accordingly, it was difficult to directly deposit uniform semiconductor film on the substrate having the non-flat surface.

SUMMARY OF THE INVENTION

According to the present invention, there is provided a method of making a semiconductor film which comprises the steps of: placing a substrate having a non-flat surface in a reaction chamber including at least a pair of discharge electrodes, an inlet of a reaction gas for producing a desired semiconductor film and an outlet for reduced pressure; and performing a discharge in the presence of the reaction gas of producing the semiconductor film, while arranging the non-flat surface of the substrate outside a plasma region formed between the discharge electrodes and further locating the non-flat surface substantially in a perpendicular direction with respect to the electrode surfaces of discharge electrodes, thereby depositing a semiconductor film on the non-flat surface of the substrate.

Further, according to the present invention, a method of making a photovoltaic device using the method described above is provided.

BRIEF DESCRIPTION OF THE DRAWINGS

FIG. 22 is a sectional view taken along III—III line of the device of FIG. 21; and FIG. 23 is a sectional view taken along VI—VI line of the device of FIG. 21.

DESCRIPTION OF THE PREFERRED EMBODIMENTS

One of the most characteristic points of the present invention is to arrange a substrate for depositing a semiconductor film outside a plasma region. Another of the most characteristic points is to substantially locate the substrate in a perpendicular direction with respect to electrode surfaces of discharge electrodes, thereby arranging a non-flat surface of the substrate in opposition to the plasma region.

Substrates having at least a non-flat surface may be employed. Cylindrical substrates, substrates with corrugated curved surfaces, and the like may be typically given. Further, its material may depend on the use, and usually it may be preferable to utilize insulating materials although insulating materials such as glass, ceramics, plastics, etc, and conductive materials such as aluminum die casting can be used.

The method of making the semiconductor film according to the present invention is preferable as a method of fabricating a photovoltaic device for directly forming a photoelectric conversion region on a substrate particularly having a non-flat surface. That is, using a substrate on which a film electrode has been provided, the photoelectric conversion region can be made by depositing a semiconductor film according to the method described above and further depositing an electrode on the semiconductor film, whereby the photovoltaic device directly provided with the photoelectric conversion region on the surface will be obtained. In this case, it may be preferable to use transparent materials as substrates, and it may also be preferable to employ transparent conductive oxide layers such as indium tin oxide as film electrodes.

The photoelectric conversion region may be generally divided into sections. The division may be performed by patterning the film electrode, the semiconductor film and the upper electrode, respectively, using masks and energy beam.

A method of making a semiconductor film on a substrate according to the present invention will now be described by embodiments applied to a method of producing a roofing tile-shaped photovoltaic device.

Figure 1:
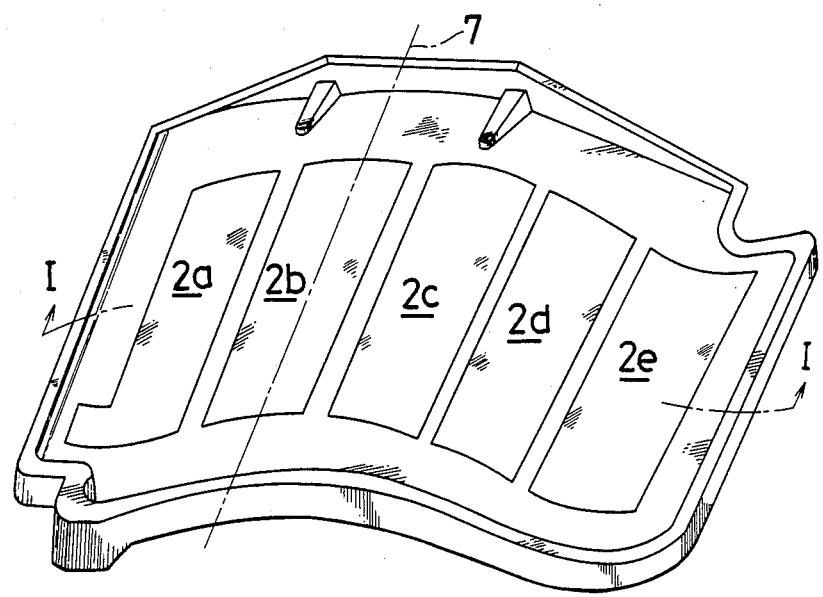
FIG. 1 is a perspective view showing one embodiment of a photovoltaic device produced by a fabricating method according to the present invention.
Figure 2:
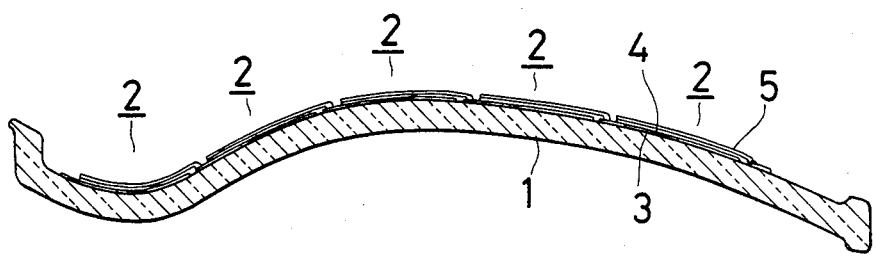
FIG. 2 is a sectional view taken along I—I line of FIG. 1.

FIGS. 1 and 2 show a photovoltaic device produced by the method of the present invention, wherein FIG. 1 is a perspective view and FIG. 2 is a sectional view taken along I—I line in FIG. 1. (1) is a substrate which is obtained by molding a transparent and insulating material such as reinforced glass, transparent ceramics, etc into a tile and which includes a corrugated insulated surface. (2a) to (2e) are a plurality of photoelectric conversion regions which are arranged on the insulated surface of the substrate (1) at desired distances. Each photoelectric conversion region (2a) to (2e) presents a film-shaped structure of micron order which is provided by successively depositing a transparent conductive film (3) such as tin oxide, indium tin oxide, etc, an amorphous silicon system semiconductor film (4) having a semiconductor junction, and a back electrode film (5) making an ohmic contact with the semiconductor film on the substrate (1).

The amorphous semiconductor film (4) includes P-type layer with a thickness of the order of 50 to 250 Å, an I-type (intrinsic) layer with a thickness of the order of 4000 to 7000 Å, and N-type layer with a thickness of the order of 300 to 600 Å from the light receiving surface so as to form PIN junction parallel to the film surface in the interior thereof, which are successively deposited on the substrate. accordingly, when the solar rays are applied to the amorphous semiconductor film through the substrate (1) and the transparent conductive film (3), free electrons and holes are mainly generated in the I-type layer. The resulting electrons and holes are attracted by the electric potential of the PIN junction provided by the respective layers and collected to each transparent conductive film (3) and each back electrode film (5), so that added electric power will be obtained by electrically connecting the transparent conductive film (3) of the photoelectric conversion region (2a) to (2e) to the back electrode film (5) in series.

FIGS. 3 to 11 are partially enlarged sectional views and schematic perspective views for explaining a method of making the photovoltaic device shown in FIG. 1.

Figure 3:
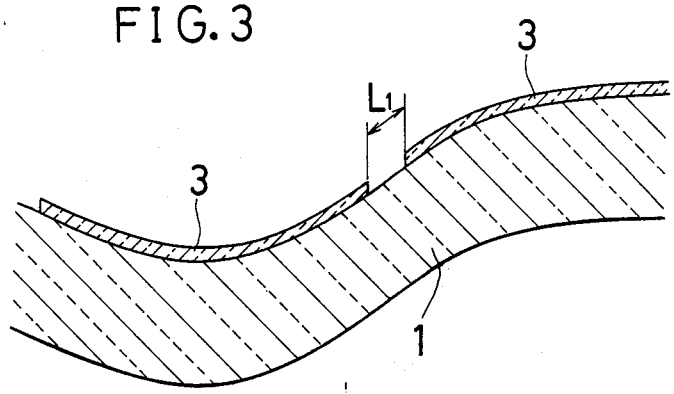
FIGS. 3, 6, 8, 9 and 10 are partially enlarged sectional views for successively explaining processes for making the device shown in FIG. 1

An indium oxide layer and a tin oxide layer are successively deposited by electron beam evaporation techniques on entire curved surface of the substrate which includes a plurality of photoelectric conversion regions (2a) to (2e), while covering the circumference of the substrate (1) with a mask, thereby providing the transparent conductive film (3) with a thickness of 500 to 4000 Å having a laminated structure thereon. FIG. 3 shows a condition such that the transparent conductive film (3) is divided into respective photoelectric conversion regions (2a) to (2e) by applying an energy beam such as laser beams thereto. Nd:YAG laser having the wavelength of 1.06 $\mu$m, the energy density of $7 \times 10^7$ W/cm$^2$, and the pulse frequency of 3 KHz is preferably used as the laser. The transparent conductive film (3) is patterned at the scanning speed of 50 mm/sec by using an objective with the focus of 50 mm. The distance (L1) between transparent conductive films (3), which is obtained by removing conductive film by laser patterning process, is given by about 50 $\mu$m.

The point to be remarked in the laser patterning process is that the distance between transparent conductive films (3) of the workpiece must not be greatly changed. That is, with respect to the laser beam applied to the objective, the energy density and the processing width are controlled by the convergence action due to the lens. Therefore, when the distance between workpieces is greatly changed as described above, the energy density and the processing width are also changed so that desired processing can not be performed.

Figure 4:
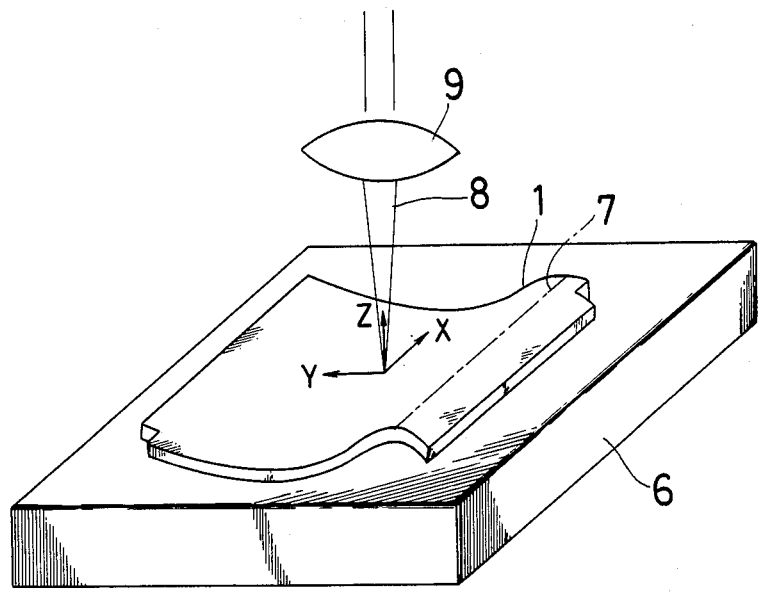
FIG. 4 is a schematic perspective view showing a laser patterning (removal) process for the device of FIG. 1.

Accordingly, when the transparent conductive film (3) directly deposited on the curved insulated surface is intended to be divided into respective photoelectric conversion regions (2a) to (2e), the substrate (1) is disposed on XYZ stage (6) which is movable in directions of X, Y and Z axes as shown in FIG. 4, and the direction of X axis on XYZ stage (6) is aligned with the direction of edge line of the surface of an the substrate (1). The laser beam (8) is then applied to the workpiece in the process for moving the stage in the direction of X axis while keeping the distance between the objective (9) and the workpiece at a constant state. Thereafter. when the removal of the transparent conductive film (3) located at one space portion is finished by moving the substrate (1) in the direction of X axis, the substrate (1) is moved in the direction of Y axis so as to oppose the objective (9) to the transparent conductive film (3) located at the portion to be next removed. Under the condition, the distance between the objective (9) and the workpiece is different from such a case that the laser beam has been applied to the transparent conductive film, because the curved insulated surface of the substrate (1) is varied in direction of Y axis. Accordingly, XYZ stage (6) is vertically moved in the direction of 7, axis and corrected to obtain predetermined distance. After the correction, XYZ stage (6) is again moved in the direction of X axis with the result that unwanted transparent conductive film (3) located at a space portion is removed by application of the laser beam. Such operations are repeatedly carried out to pattern the transparent conductive film (3) in parallel with the curved edge line (7) as shown in FIG. 3.

Figure 5:
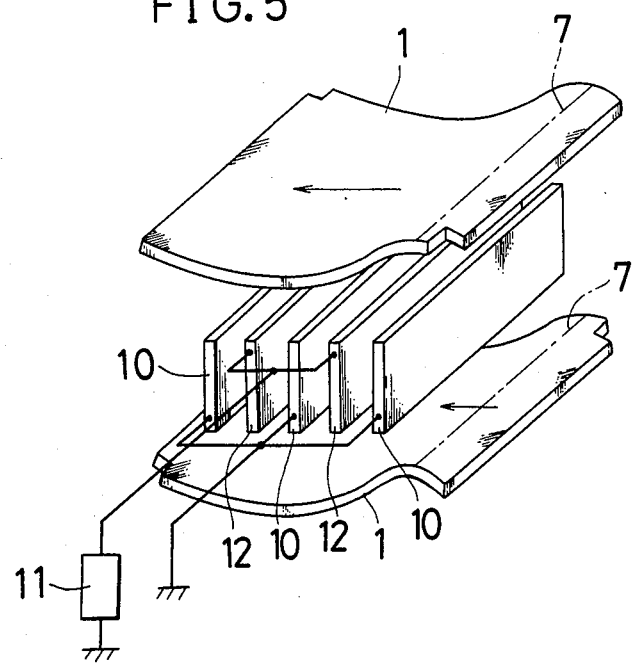
FIG. 5 is a schematic perspective view showing a first embodiment for a deposition (formation) process of an amorphous semiconductor.

After patterning of the transparent conductive film (3), the process turns on the deposition process of the amorphous semiconductor film (4). FIG. 5 shows schematically a process for depositing an amorphous silicon system amorphous semiconductor film (4), such as amorphous silicon (a-Si:H), amorphous silicon carbide (a-$Si_xC_{1-x}$:H), amorphous silicon stannate (a-$Si_ySn_{1-y}$:H), and the like, on the substrate (1) by exciting a glow discharge in a silicon compound atmosphere such as monosilane ($SiH_4$), disilane ($Si_2H_6$), and the like and plasma decomposing the reaction gas.

The substrate (1) with the curved insulated surface used for the present invention are not disposed between parallel flat electrodes (discharge electrodes) opposed to each other. The deposition surfaces of the substrates (1) are arranged outside the parallel flat electrodes and substantially located in a perpendicular direction with respect to opposite surfaces of the electrodes. In such a condition, the amorphous semiconductor film (4) is produced while moving the substrates (1) in the direction of the curved surface as shown in the drawing, that is, in the perpendicular direction with respect to the edge line (7). In the embodiment of FIG. 5, the parallel flat electrodes constitute a multielectrode structure in which earth electrodes (10),(10),(10) and radio frequency electrodes (12)(12) are alternately opposed and arranged in parallel, and the substrates (1) are transferred in the parallel direction of these electrodes (10) and (12).

On the multielectrode structure, however, the glow discharge is basically excited between one earth electrode (10) and one radio frequency electrode (12) that are opposed to each other, thereby generating the plasma between both electrodes, and silicon atoms, for example, obtained by decomposing the reaction gas are deposited on the curved surfaces of the substrates (1) near located outside both electrodes to form gradually the amorphous semiconductor film (4) on the substrate surfaces. Accordingly, it is not always necessary to adopt the multielectrode structure.

Figure 6:
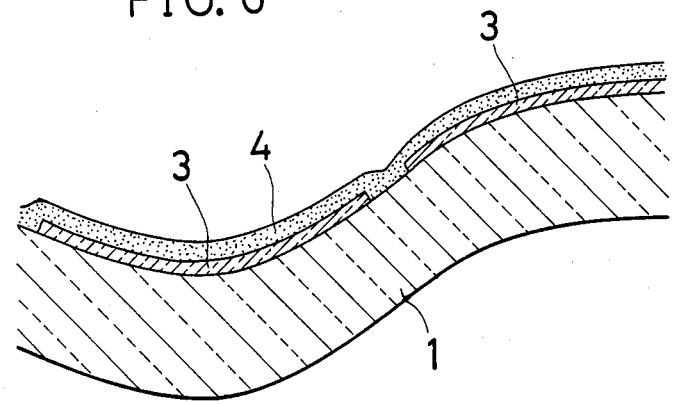

By arranging the substrates (1) outside alternately opposed earth electrodes (10)(10)(10) and radio frequency electrodes (12)(12), as described above, the deposition surfaces of the substrates (1) are separated from the moving region of the high speed charged particles in the plasma, and the collision of charged particles is remarkably reduced with the result that unwanted damage to the amorphous semiconductor film (4) is decreased. Next, for forming (depositing) the amorphous semiconductor film (4), the substrates (1) are moved in the curved direction of each surface (the parallel direction of electrodes), thereby providing the amorphous semiconductor film (4) having high uniformity as shown in FIG. 6.

In addition, it is also possible to increase the deposition rate of the film since the high frequency output, which has been suppressed so as to reduce the damage caused by the high speed charged particles during the deposition of the amorphous semiconductor film, can be increased.

In the embodiment shown in FIG. 5, two substrates (1) are provided so as to put alternately disposed earth electrodes (10)(10)(10) and radio frequency electrodes (12)(12) therebetween. Accordingly, the formation of the amorphous semiconductor film (4) is performed against two substrates (1)(1) at the same time. At this time, a heater to heat the substrates (1)(1) is buried in a recessed portion of a reaction chamber not shown, thereby uniformly heating respective substrates (1)(1) from back surfaces.

Figure 7:
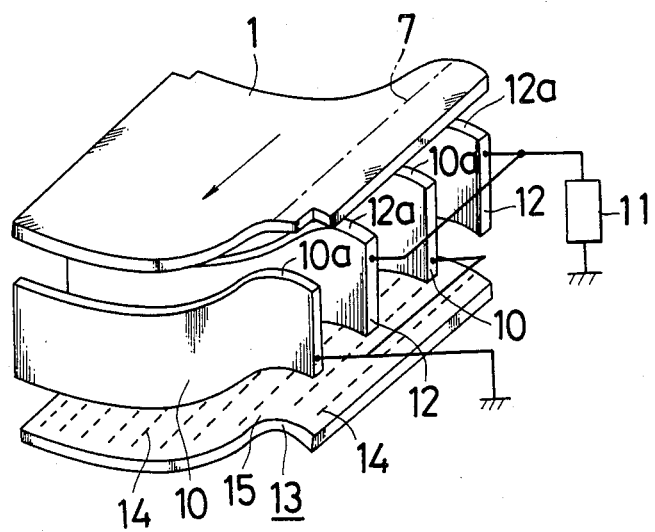
FIG. 7 is a schematic perspective view showing a second embodiment of a deposition (formation) process of an amorphous semiconductor.

FIG. 7 shows schematically another deposition (formation) process of the amorphous semiconductor film (4), which is different from the embodiment described above, that is, the first embodiment in the concrete structure including the opposed condition relating to earth electrodes (10)(10) and radio frequency electrodes (12)(12) and the substrate (1), and a gas supply member (13) for discharging the reaction gas. That is, opposite surfaces (10a)(12a) of respective earth electrodes (10)(10) and radio frequency electrodes (12)(12) opposed to the substrate (1) present curved surfaces with similar configuration so as to be opposed to the curved surface of the substrate in parallel. Accordingly, by rendering the curved surfaces with similar configuration to opposite suriaces (10a)(12a) of respective electrodes (10)(12), the opposing distance between opposite surfaces (10a)(12a) and the substrate (1) becomes enual so that uniform amorphous semiconductor film (4) can be obtained in the stopped condition of the substrate. However, if more uniform amorphous semiconductor film (4) is desired, it may be preferable that the deposition process is performed in the same manner as the first embodiment, while moving the substrate (1) in the direction of earth electrodes (10)(10) and radio frequency electrodes (12) (12) located in parallel [the direction of edge line of the substrate (1)] as shown by an arrow in the drawing.

Further, the gas supply member (13) includes a gas discharge surface (15) having a great number of discharge apertures (14)(14). The gas discharge surface (15) is arranged so as to be opposed to the curved surface of the substrate (1) through earth electrodes (10)(10) and radio frequency electrodes (12)(12), and also presents similar configuration to the surface of the substrate (1) so as to make the opposing distance between the gas discharge surface and the curved surface of the substrate equal. The reaction gas to be discharged depends on the amorphous semiconductor to be formed. However, in the case of amorphous silicon, for example, diborane ($B_2H_6$) containing P-type impurity or phosphine containing N-type impurity is preferably added to a base of monosilane ($SiH_4$) or disilane ($Si_2H_6$). Another substrate (1) may be employed instead of the gas supply member (13).

According to first and second embodiments, the amorphous semiconductor film (4) can be produced by approximately same reaction conditions.

The following shows basic reaction conditions for producing PIN junction type amorphous silicon.

| | |
|---|---|
| Substrate temperature | 250 to 300° C. |
| Radio frequency power source | 13.56 MHz |
| Radio frequency output | 100 W |
| Reaction gas (composition ratio) | |
| P—type layer | $B_2H_6/SiH_4 = 0.1\%$ |
| I—type layer (non-doped layer) | $SiH_4 = 100\%$ |
| N—type layer | $PH_3/SiH_4 = 1\%$ |
| Gas pressure | 0.3 to 1 Torr |
| Gas flow rate | 10 to 40 cc/min |

Figure 11:
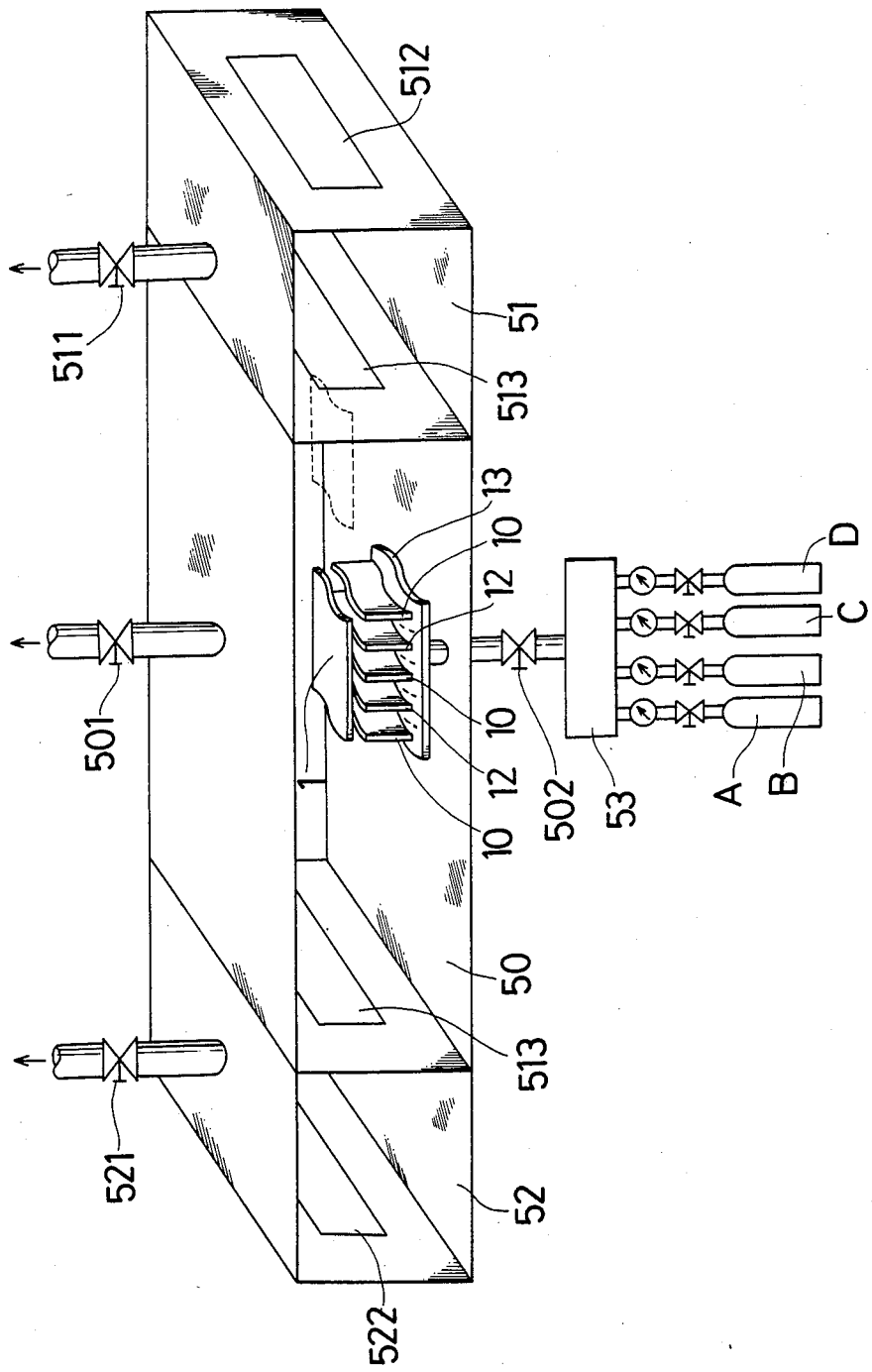
FIG. 11 is a schematic perspective view showing an apparatus used for a fabricating method according to the present invention.

Further, a concrete reaction apparatus is shown in FIG. 11. FIG. 11 is a schematic perspective view of the reaction apparatus corresponding to the second embodiment, which includes a reaction chamber (50) comprising discharge electrodes (10)(12), the gas supply member (13) having discharge apertures for a desired reaction gas, and a reduced pressure and exhaust valve (501). In the drawing, (51) is a charging chamber for the substrate, (52) is a taking out chamber for the substrate, (511) and (521) are valves for reduced pressure, (512) is an inlet shutter, (522) is an outlet shutter, (513) is an isolation shutter, (53) is a gas mixer, and (502) is a gas supply valve, respectively. (A) to (D) show reaction gas bombs. (A) is an $SiH_4$ bomb, (B) is a $B_2H_6$ bomb, (C) is a $PH_3$ bomb, and (D) is a $CH_4$ bomb. In the drawing, a substrate transfer arrangement for passing the substrate through the charging chamber (51), the reaction chamber (50) and the taking out chamber (52) is omitted.

$SiH_4$ used as the silicon supply gas can be substituted for gases expressed by $Si_nH_{2n+2}$ (n is integer of above 2). $Si_2H_6$, $Si_3H_8$, $Si_4H_{10}$ and the like is concretely given. $SiF_4$ may be employed under certain circumstances.

Gases containing Group III element such as $[(CH_3)]_3$ Ga, $(C_2H_5)_3$ Al, and the like can be used instead of $B_2H_6$ for P-type doping gas.

$PH_3$ used as N-type doping gas can be substituted for gases containing Group V element such as $AsH_3$, $NH_3$, and the like.

Of course, additional gases for producing the semiconductor film known in the field may be added to these gases.

Figure 8:
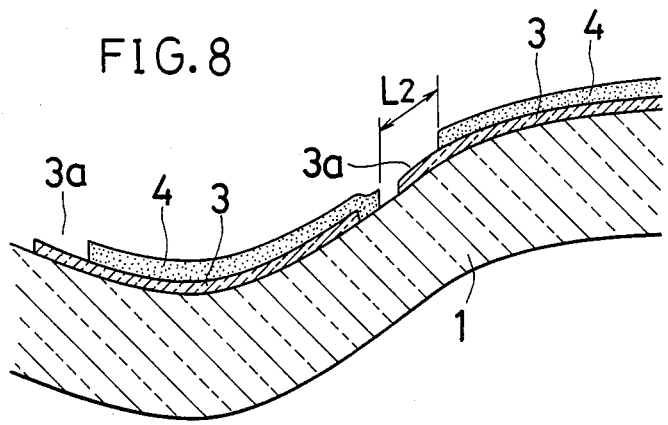

The amorphous semiconductor film (4) such as amorphous silicon, uniformly deposited on the curved surface of the substrate (1) according to the method of the present invention, is placed on XYZ stage (6) shown in FIG. 4. As shown in FIG. 8, space portions of the amorphous semiconductor film (4) are removed by application of a laser beam (8) to provide separated photoelectric conversion regions (2a) to (2e), and a part of each transparent conductive film (3), covered with the removed amorphous semiconductor film (4), is exposed over whole length in the scanned direction of the laser beam (8). Nd:YAG laser having the wavelength of 1.06 μm, the energy density of $5 \times 10^7$ W/cm² and the pulse frequency of 3 KHz is used as the laser to be employed. The distance (L2) between removed amorphous semiconductor films (4) is set to about 200 μm.

For keeping the distance between the objective (9) and the workpiece at a constant state in the same manner as the transparent conductive film (3), the scanning direction of the laser beam (8) is the direction of edge line (7) in the curved surface of the substrate (1) that is aligned with X axis of XYZ stage (6). The laser beam (8) is scanned at a rate of 50 mm/sec by moving XYZ stage in the direction of X axis. When one of space portions has been scanned by the laser beam (8), XYZ stage (6) is transferred in the direction of Y axis to oppose the amorphous semiconductor film (4) to be next removed to the objective (9). Thereafter, XYZ stage (6) is moved in the direction of Z axis so as to correct the opposing distance between the amorphous semiconductor film and the objective to predetermined value. The scanning operation of the laser beam (8) is repeated by again moving the stage in the direction of X axis, thereby patterning the amorphous semiconductor film (4)(4) in parallel with the edge line (7) of the substrate surface under the exposed condition of a part of the transparent conductive films (3)(3).

Figure 9:
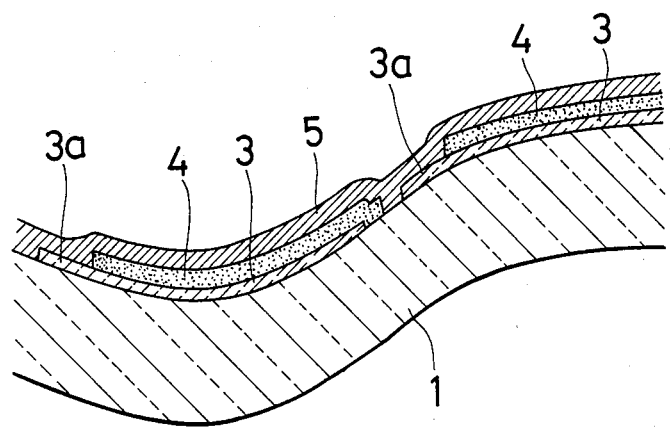

Next, as shown in FIG. 9, a back electrode film (5) is continuously deposited on all of photoelectric conversion regions (2a) to (2e) which include exposed surfaces of amorphous semiconductor films (4)(4) and transparent conductive films (3)(3).

Figure 10:
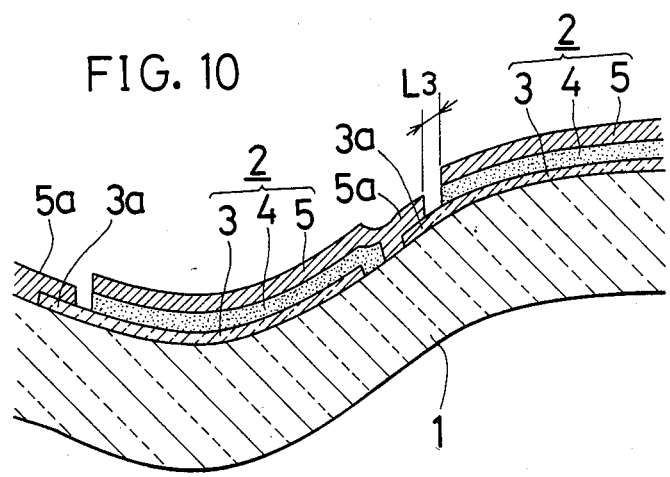

As shown in FIG. 10, the spaoe portions of the back electrode film (5) are removed by application of the laser beam (8) in order that an extended portion (5a) of the back electrode film (5) extending from one of photoelectric conversion regions (2a) to (2e) is connected to an exposed portion (3a) of the transparent conductive film (3) of adjacent photoelectric conversion region. The length (L3) is set to 50 μm. The laser to be employed is Nd:YAG laser in the same manner as the transparent conductive film (3) and the amorphous semiconductor film (4). It is scanned at a rate of 50 mm/sec by transferring XYZ stage (6) in the direction of X axis.

On the operation after scanning the back electrode film in the direction of X axis, that is, on correcting the distance between the objective (9) and the workpiece, the description is omitted because it is the same process as the laser patterning (removal) process described above. These patternings may be performed using a mask.

When the removing processes of films are carried out by application of the laser beam (8), one must note that if another film is present under the film portion to be removed, it is not damaged. The density of threshold value for processing the amorphous silicon system amorphous semiconductor film (4) by the laser beam (8) is about $4 \times 10^7$ W/cm² that is lower than $7 \times 10^7$ W/cm² for the transparent conductive film (3). Therefore, if the laser beam (8) is directly applied to the transparent conductive film (3) in removing process of the amorphous semiconductor film (4), unwanted damage is not rendered thereto.

However, it is general that materials capable of forming the back electrode film, that is, metals making an ohmic contact with the amorphous semiconductor film (4) are high in the energy density of processing threshold value as compared with that of the transparent conductive film (3). Since aluminum, for example, is low in the absorption rate of the laser beam and is good in the thermal conductivity, the applied heat of the laser beam is dissipated. Accordingly, the energy density of processing threshold value shows slightly higher value given by about $8 \times 10^7$ W/cm² at 5000 Å in thick than that of the transparent conductive film although it depends upon the film thickness.

It is then preferable to reduce the energy density of processing threshold value to $2 \times 10^7$ W/cm². This is achieved without constituting the back electrode film (5) by only aluminum by making the film thickness of aluminum thin such as about several hundreds Å and putting a material having a high absorption rate and a thickness of the order of 5000 Å, such as titanium or titanium-silver alloys, on the aluminum surface to form a laminate. The back electrode film (5) may be constituted by only titanium or titanium—silver alloys.

Further, when the amorphous silicon system amorphous semiconductor film on a surface of a photoconductor drum by the plasma decomposition of the reaction gas such as $SiH_4$ and the like described above, a photoconductive layer composed of an amorphous semiconductor film for making uniform electrostatic latent images with good quality can be obtained if the deposition process is carried out while rotating and transferring the photoconductor drum.

Figure 12:
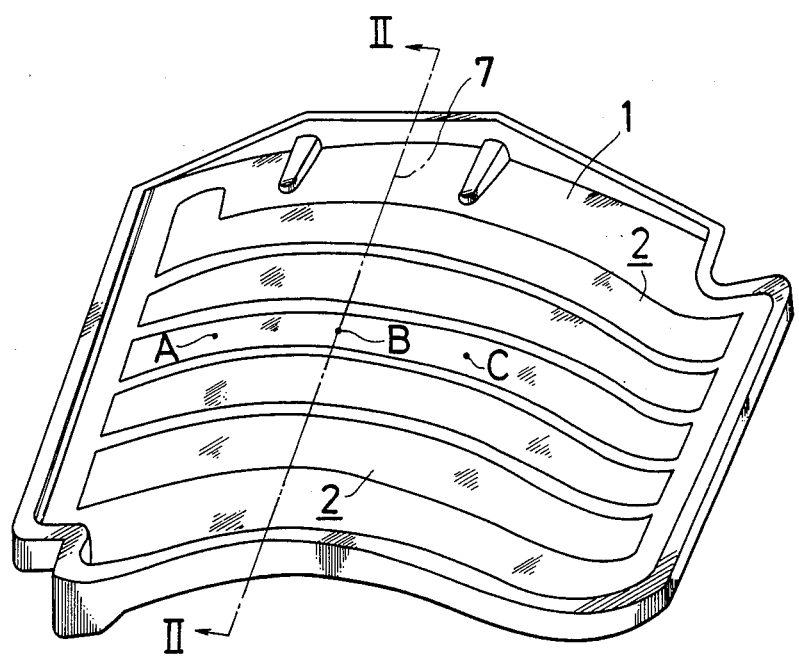
FIG. 12 is a perspective view showing another embodiment of a photovoltaic device produced by a fabricating method according to the present invention.
Figure 13:
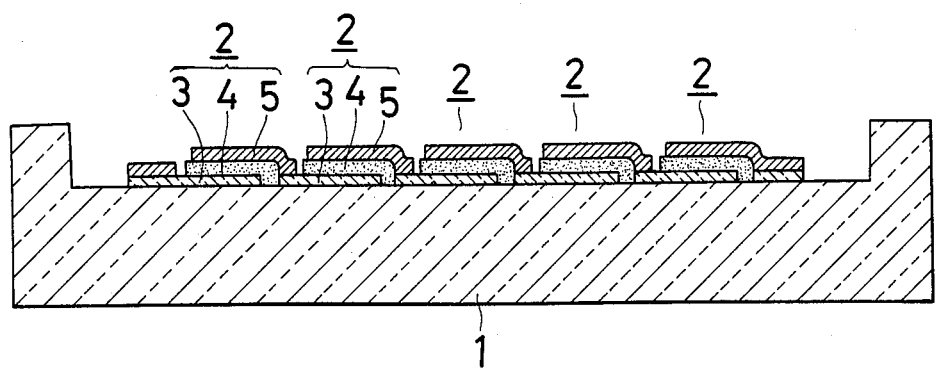
FIG. 13 is a sectional view taken along II—II line of FIG. 12.

FIGS. 12 and 13 are another example of a photovoltaic device manufactured by the method according to the present invention.

The characteristic of this embodiment is that a plurality of photoelectric conversion regions (2)(2) are arranged so as to intersect with the edge line (7) of the curved surface of the substrate (1). That is, in the embodiment strip-shaped photoelectric conversion regions (2)(2) are arranged in parallel so that long sides of regions are vertically intersected with the edge line (7) of the corrugated curved surface. FIG. 13 corresponds to the sectional view taken along such edge line (7).

The photovoltaic device shown in FIG. 12 is more preferable as compared with the device shown in FIG. 1. The reason for this will be described as follows.

Figure 14:
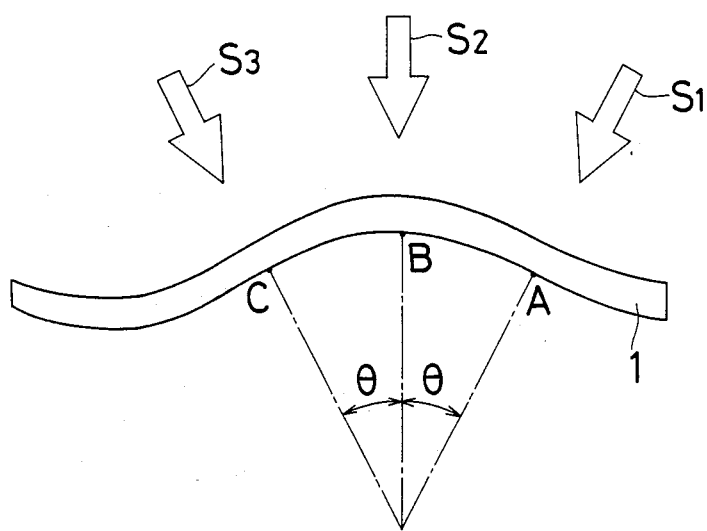
FIG. 14 is a view for explaining a function of the device shown in FIG. 12.

FIG. 14 shows schematically a relation between solar rays $S_1$, $S_2$ and $S_3$ and incident angles with respect to the photoelectric conversion regions when the photovoltaic device of the embodiment is installed on a roof facing the south. This is an example in the case where the sun with an angle of $\theta$ is inclined to the east or west with the southing as the center. That is, when the solar rays $S_1$ irradiate the photoelectric conversion region (2)(2) from the position that is inclined in the direction of the south by an angle of $\theta$, they are vertically applied to the light receiving portion A, and the photoelectric conversion operation of the light receiving portion A becomes maximum. However, as the solar rays $S_1$ are not vertically applied to light receiving portions B and C, the incident light energy become hv sin $\alpha_1$ and hv sin $\alpha_2$, respectively. when the light energy of the solar rays $S_1$ are given by hv and respective incidence angles are rendered by $\alpha_1$ and $\alpha_2$. Accordingly, the light energy applied to the light receiving portion C having low incidence angle becomes minimum.

But, the incident light energy is given by only the solar rays $S_1$ as the incidence light. The incidence of light from another direction, the reduction of incidence light due to reflection, and the like are not considered.

Accordingly, respective light receiving portions A, B and C are operated as photoelectric conversion portions in proportion to the incident light energies hv, hv sin $\alpha_1$ and hv sin $\alpha_2$. The quantity of power generation of the light receiving portion A becomes maximum, while the quantity of power generation of the light receiving portion C becomes minimum. That is, the quantities of power generation in respective light receiving portions are different from one another.

In the case of the southing where the solar rays $S_2$ are vertically applied to the light receiving portion B, the quantity of power generation of the light receiving portion B becomes maximum, and the quantity of the light receiving portion A equal to sin component of the incidence angle and the quantity of the light receiving portion C are lower than that of the light receiving portion B.

Further, when the solar rays $S_3$ irradiate the photoelectric conversion regions (2)(2) from a position where the sun is inclined in the west at an angle of $\theta$, the relative relation among respective quantities of light receiving portions A, B and C are reversed; the light receiving portion C becomes maximum conversely when the photoelectric conversion regions are irradiated from a position where the sun is inclined in the east at an angle of $\theta$.

As described above, the quantity of power generation in each light receiving portion is varied with the movement of the sun.

On the contrary, in the photovoltaic device (the area of the photoelectric conversion regions is equal to one another) shown in FIG. 1, the first photoelectric conversion region (2a) renders maximum photoelectric conversion operation with respect to the solar rays $S_1$ inclined in the west at an angle of $\theta$, thereby generating a photocurrent of about 15 mA/cm$^2$. But, the respective photocurrents of second and third photoelectric conversion regions (2b) and (2c) become 15 mA/cm$^2 \times$ sin $60° \approx 13$ mA/cm$^2$ and 15 mA/cm$^2 \times$ sin $30° = 7.5$ mA/cm$^2$ when incidence angles $\alpha_1$ and $\alpha_2$ are given by $60°$ and $30°$. Since whole output current of the photovoltaic device is regulated by the minimum output as known in the prior art, it becomes 7.5 mA/cm$^2$ of the third photoelectric conversion region (2c). That is, in the photovoltaic device that includes photoelectric conversion regions (2a)(2b) and (2c) arranged in parallel with the edge line (7) of the tile-shaped substrate (1) as shown in FIG. 1, if a certain photoelectric conversion region generates maximum photocurrent with the movement of the sun, whole output power of the photovoltaic device is regulated by the low photocurrent when the photocurrent of another photoelectric conversion region becomes low.

However, when respective photoelectric conversion regions (2)(2) are aligned and arranged so as to intersect with the edge line (7) as shown in FIG. 12, one of photoelectric conversion regions (2)(2) includes all of light receiving portions A, B and C at the same time. Accordingly, if the sun is moved, photocurrents generated by respective photoelectric conversion regions (2)(2) are always equal to one another with the result that whole output current of the photovoltaic device is increased. As compared with the device of FIG. 1 having the output current of 7.5 mA/cm$^2$, for example, the output of the device shown in FIG. 12 is given by $(15+13+7.5)/3=11.8$ mA/cm$^2$ whose value is rendered by the arithmetic mean of photocurrents generated in the light receiving portions A, B and C. Accordingly, the output power is increased to about 60% in the photovoltaic device which is provided with both the substrate (1) having the same configuration and the equal total light receiving area.

One suitable structure in the photovoltaic device shown in FIG. 12 is practically constituted by using a reinforced glass substrate having a height difference of curved surface of about 30 mm and about 300 mm square (thickness:about 10 mm) and providing about 11 photoelectric conversion regions (2)(2) on the glass substrate at equal distances of several mm. This photovoltaic device can generate the electric power of about 2 W every one sheet or unit. Therefore, the electric power can be sufficiently supplied to general homes during daytime by using about 500 sheets, for example, as roofing tiles.

Figure 15:
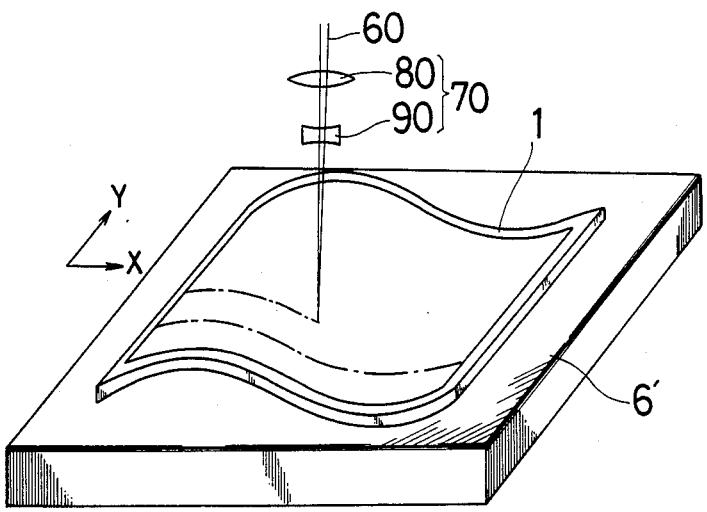
FIG. 15 is a schematic perspective view showing a laser patterning process for the device of FIG. 12.
Figure 16:
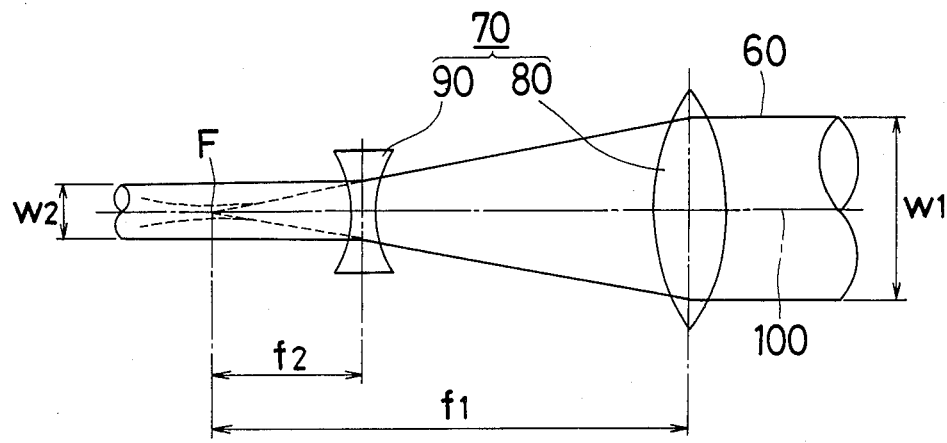
FIG. 16 is a view for explaining convergence of a laser beam.

The photovoltaic device shown in FIG. 12 can be produced in the same manner as the device shown in FIG. 1. However, if the laser beam is converged in the patterning process of the amorphous semiconductor film so as to obtain the photoelectric conversion regions (2)(2) by merely using one projected tye objective, there is provided such a problem that the opposing distance between the objective and the workpiece is changed. This is a critical problem as compared with case for patterning the amorphous semiconductor film or transparent conductive film in parallel with the edge line as shown in FIG. 1. As shown in FIGS. 15 and 16, a convergence arrangement (70) for a laser beam (60) comprises a convex lens (80) with a focal length f1 located at a side of laser source (not shown), and a concave lens (90) with a short focal length f2 coaxially located in a side of the workpiece so as to align the focus (F) of the convex lens (80) with the virtual focus. That is, the laser beam (60) emitted from the laser source and being in parallel with an optical axis (100) is applied to the convex lens (80), refracted and gradually converged towards the focus (F). The laser beam (60), which is adapted to be entered in the concave lens (90) disposed in the convergent way, is applied to the concave lens (90) since the virtual focus of the concave lens (90) is aligned with the focus (F) of the convex lens (80). After refraction, the laser beam is transmitted in parallel with the optical axis (100).

Figure 17:
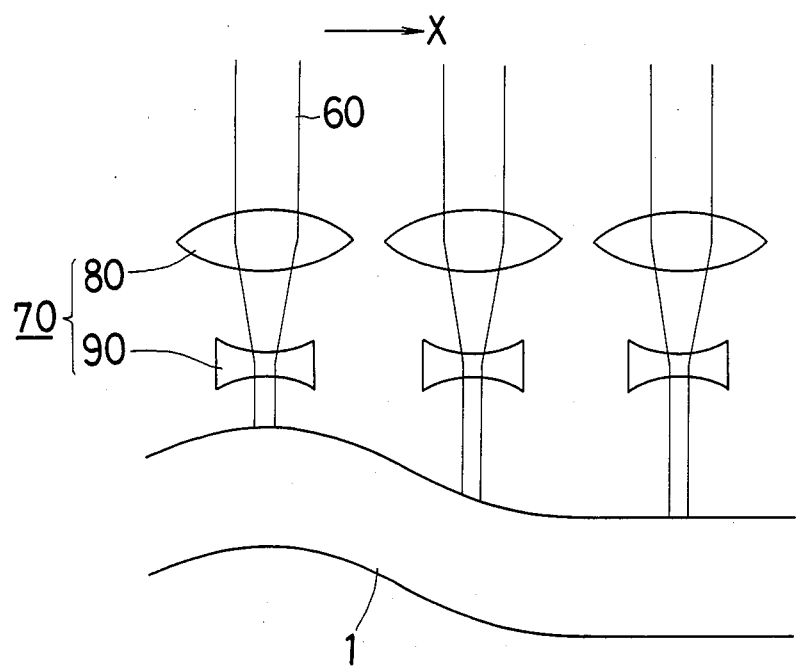
FIG. 17 is a view for explaining an irradiating condition of the laser beam.

As described above, after the beam diameter w1 of the laser beam (60) is once converged by the convex lens (80), the laser beam (60) is transmitted through the concave lens (90) and converted to a parallel beam with a beam diameter w2 to perform desired processing. Consequently, even if the opposing distance between the concave lens (90) and the workpiece was varied along the curved surface of the substrate (1) by moving (scanning) XY stage (6') in a direction of X axis, the beam diameter w2 of the laser beam (60) applied to the workpiece, that is, the energy density and the processing width will not be changed as shown in FIG. 17, thereby carrying out desired processing.

In the explanation described above, there has been described the example in detail wherein the converged diameter w2 of the laser beam (60) is kept constant by combination of the convex lens (80) and the concave lens (90) without variation of the opposing distance between the workpiece and the concave lens. However, if the scanning direction of the laser beam (60), for example, was given by the direction of X axis as shown in FIG. 5, it can be possible to use a lens array or short focus lens array as convergence arrangements. The lens array is that the focal length is momentarily changed in the direction of X axis corresponding to the variation of the opposing distance between the workpiece and the cancave lens. The short focus lens array is that rod-shaped short focus lenses, whose lens length is momentarily changed, are aligned and arranged in the direction of X axis.

Figure 18:
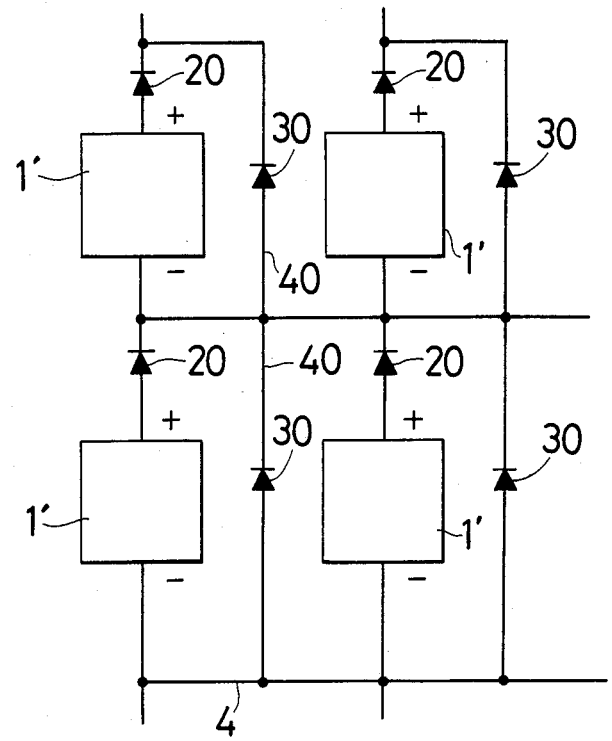
FIG. 18 is a circuit diagram illustrating a used condition of the photovoltaic device produced by the fabricating method according to the present invention.

The tile-shaped (corrugated) photovoltaic device (1') produced by the method of the present invention described above is usually employed by combining a plurality of devices together with outside connected reverse-current protective diodes (20) and reverse withstand voltage diodes (30) as shown in FIG. 18.

Under certain circumstances, these reverse-current protective diodes and reverse withstand voltage diodes are directly provided on the substrates.

Figure 19:
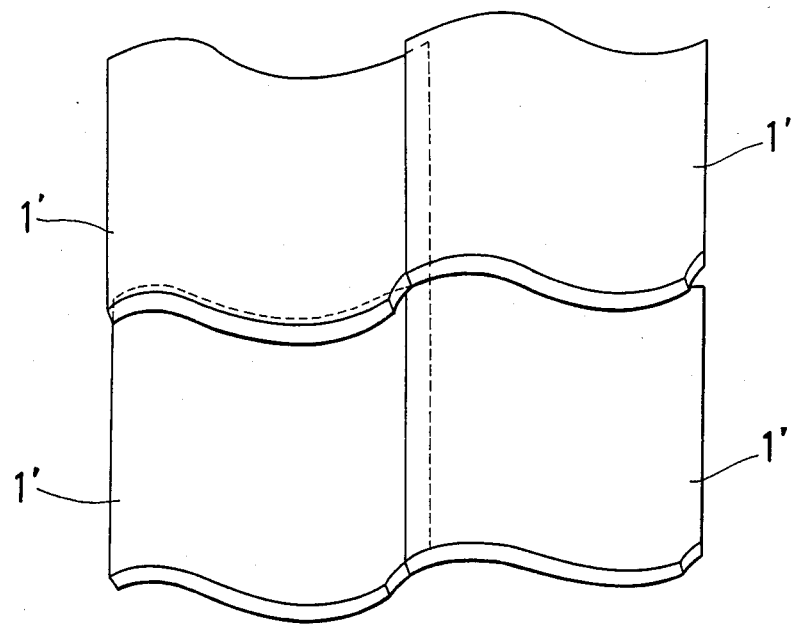
FIG. 19 is a view for explaining a used condition of still another embodiment of a photovoltaic device obtained by the fabricating method according to the present invention.

FIG. 19 shows this embodiment. Photovoltaic devices (1') (1') with the film-shaped photovoltaic elements, the reverse-current protective diodes and reverse withstand voltage diodes are contiguously arranged in such a manner that a part of them is overlapped at four sides as usual tile array when a house is covered with tiles. Such example is adapted to tile arrangements of roofs and directed to power modules utilizing solar light irradiated to the roof.

Figure 20:
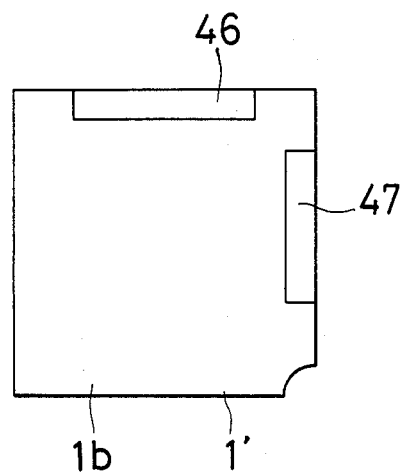
FIG. 20 is a plan view showing the device of FIG. 19.
Figure 21:
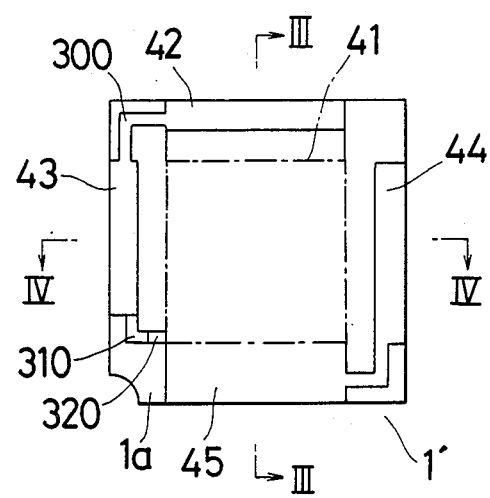
FIG. 21 is a bottom view showing the device of FIG. 19.

FIGS. 20 to 23 show details of the device (1'). Referring to FIGS. 20 and 21 illustrating main and back surfaces of the device (1'), a film-shaped photoelectric conversion region (41) is deposited on the center of the back surface (1a) of the substrate. A film-shaped reverse current protective diode (42) and a film-shaped reverse withstand voltage diode (43), which are electrically connected to the region (41), are provided at upper and left sides of the back surface. First and second conductive films (44) and (45), electrically connected to the region (41), are further provided at right and lower sides of the back surface. Third and fourth conductive films (46) and (47), electrically connected to the reverse-current protective diode (42) and the reverse withstand voltage diode (43), are deposited at upper and right sides of the main surface (1b) of the substrate.

First to fourth conductive films (44) to (47) are located at overlapped portions of adjacent substrates when devices (1') are arranged in the form of the tile as shown in FIG. 19. The electrical connection among respective substrates is achieved by connecting each conductive film (44) to (47) to the fourth conductive film (47), the third conductive film (46), the second conductive film (45) and the first conductive film (44) of adjacent substrates. The reverse-current protective diode (42) and the reverse withstand voltage diode (43) are also located at the overlapped portions, so that any influence is not rendered to the occupying area of the device (1').

FIGS. 22 and 23 show details of the device and respective diodes (42)(43). The device (1') comprises a plurality of parallel regions (11a) to (11e) each of which includes the transparent electrode film (3) deposited on the back surface (1a) of the substrate, the amorphous semiconductor film (4) with PIN junction deposited on the electrode film (3), and the back electrode film (5) of aluminum. Light entered in the substrate (1) from the main surface (1b) reaches the amorphous semiconductor film (4) through the transparent conductive film (3) to perform the power generation. Respective regions (11a) to (11e) are arranged in the form of series connection, so that voltages generated in respective regions are mutually added and appear between the transparent conductive film (3) of one end region (11a) and the back electrode film (5) of the other region (11e).

The reverse-current protective diode (42) includes an amorphous semiconductor film (33) with a PN junction deposited on the extended portion (3a) of the transparent electrode film (3) constituting one end region (11a), and a cathode electrode film (34) of aluminum. A first conductive coating film (35) coated on the side surface of the substrate (1) is overlapped on the cathode electrode film (34) and extends to the substrate surface (1b) to provide the third conductive film (46).

The reverse withstand voltage diode (43) comprises an anode electrode film (26) formed on the back surface (1a) of the substrate, an amorphous semiconductor film (27) with a PN junction deposited on the anode electrode film (26), and a cathode electrode film (28) of aluminum. Any materials may be used as materials of anode electrode film (26) if making an ohmic contact with the amorphous semiconductor film (27), but it may be preferable to employ the same material as that of the transparent electrode film (3) for the purpose of the manufacture of the device. A second conductive coating film (29) coated on the side surface of the substrate (1) is overlapped on the anode electrode film (26) and extends to the substrate surface (1b) to provide the fourth conductive film (47).

Respective cathode electrode films (34) and (28) of reverse-current protective diode (42) and reverse withstand voltage diode (43) are composed of the same material and electrically connected through a wiring layer (300) (FIG. 21) formed on the back surface (1a) of the substrate. An extended portion (310) extending from the anode electrode film (26) of the reverse withstand voltage diode (43) and an extended portion (320) extending from the back electrode film (5) of another region (11c) are overlapped at respective end portions on the back surface (1a) of the substrate, thereby electrically connecting the anode electrode film (26) to the back electrode film (5).

As respective diodes (42) and (43), Schottky barrier may be used instead of PN junction. Further, either diode can be omitted under certain circumstances.

First and second conductive films (44) and (45) are provided by extending the back electrode film (5) that constitutes another region (11e).

According to the device described above, the electrical connection among photovoltaic elements of substrates will be performed only by continuously arranging substrates having photoelectric conversion regions under partially overlapped condition. Further, it is not necessary to perform the external connection for the reverse-current protective diode and the reverse withstand voltage diode by using lead wires. Consequently, the connection for many devices can be easily carried out.

What we claim is:

1. A method of forming a semiconductor film on a substrate, consisting essentially of:
    placing a substrate having a deposition surface in a reaction chamber having therein at least one pair of opposed discharge electrodes having opposing electrode surfaces, said reaction chamber further including an inlet of a reaction gas for producing a desired semiconductor by a plasma glow discharge decomposition reaction thereof, and an outlet for reducing the pressure within said reaction chamber; and
    performing a discharge between said at least one pair of discharge electrodes in said reaction chamber in the presence of said reaction gas for producing said semiconductor, while arranging said deposition surface of said substrate just outside a plasma region formed between said discharge electrodes and locating said substrate deposition surface in substantially perpendicular relation with respect to said opposing electrode surfaces of said discharge electrodes,
    thereby depositing a film of said semiconductor on said deposition surface of said substrate.

2. A method of forming a semiconductor film on a substrate according to claim 1, wherein said substrate is moved during depositing of said semiconductor film on said deposition surface thereof.

3. A method of forming a semiconductor film on a substrate according to claim 1, wherein said deposition surface of said substrate is a non-flat surface and wherein a distance between one side of said discharge electrodes, at which side thereof said substrate is arranged, and said non-flat deposition surface of said substrate is adjusted so as to maintain said distance uniform during depositing of said semiconductor film on said non-flat deposition surface.

4. A method of forming a semiconductor film on a substrate according to claim 1, wherein a pair of substrates each having a deposition surface are placed in said reaction chamber and arranged so as to hold a plasma region of said discharge between opposed deposition surfaces thereof.

5. A method of forming a semiconductor film on a substrate according to claim 1, wherein plural pairs of opposed discharge electrodes are arranged in parallel within one reaction chamber.

6. A method of forming a semiconductor film on a substrate according to claim 1, wherein said deposition surface of said substrate is a non-flat surface and said discharge electrodes are provide with curved side edges so as to correspond to said non-flat deposition surface of said substrate.

7. A method of forming a semiconductor film on a substrate according to claim 1, wherein said substrate has a corrugated curved deposition surface.

8. A method of forming a semiconductor film on a substrate according to claim 1, wherein said substrate is a cylindrical substrate.

9. A method of forming a semiconductor film on a substrate according to claim 1, wherein said substrate is provided with a film electrode on its deposition surface.

10. A method of forming a semiconductor film on a substrate according to claim 9, wherein said deposition surface of said substrate is a non-flat curved surface and said film electrode is divided into a plurality of electrodes extending in a parallel or intersecting direction with respect to an edge line of said non-flat curved surface of said substrate.

* * * * *

UNITED STATES PATENT AND TRADEMARK OFFICE
CERTIFICATE OF CORRECTION

PATENT NO. : 4,670,293

DATED : June 2, 1987

INVENTOR(S) : MASARU YAMANO ET AL

It is certified that error appears in the above-identified patent and that said Letters Patent is hereby corrected as shown below:

On the cover page, Item [63], change "Jul. 30, 1985" to --- Jul. 30, 1984 ---.

Signed and Sealed this
First Day of December, 1987

Attest:

DONALD J. QUIGG

Attesting Officer        Commissioner of Patents and Trademarks